US005467046A

United States Patent [19]

Kimura

[11] Patent Number: 5,467,046
[45] Date of Patent: Nov. 14, 1995

[54] LOGARITHMIC INTERMEDIATE-FREQUENCY AMPLIFIER

[75] Inventor: Katsuji Kimura, Tokyo, Japan

[73] Assignee: NEC Corporation, Tokyo, Japan

[21] Appl. No.: 886,950

[22] Filed: May 22, 1992

[30]  Foreign Application Priority Data

May 30, 1991 [JP] Japan ................... 3-155648
May 23, 1991 [JP] Japan ................... 3-147769

[51] Int. Cl.⁶ .............................. G06F 7/556; G06F 7/24
[52] U.S. Cl. ............................................ 327/351; 327/352
[58] Field of Search ........................... 328/145, 159,
328/158, 26, 32; 307/529, 492, 494, 497,
264; 327/350, 351, 352, 104, 560, 563

[56]          References Cited

U.S. PATENT DOCUMENTS

| | | | |
|---|---|---|---|
| 3,403,347 | 2/1965 | Stull, Jr. ................... | 328/145 |
| 3,605,027 | 9/1971 | Nichols et al. ........... | 328/145 |
| 3,668,535 | 6/1972 | Lansdowne ............... | 328/145 |
| 3,719,831 | 3/1973 | Hamburg .................. | 328/145 |
| 3,757,136 | 9/1973 | Hughes ..................... | 328/145 |
| 4,090,150 | 5/1978 | Vachenauer .............. | 328/145 |
| 4,209,714 | 6/1980 | Miyamoto ................. | 328/145 |
| 4,531,069 | 7/1985 | Parker ...................... | 328/145 |
| 4,617,481 | 10/1986 | Masuda .................... | 307/491 |
| 4,680,553 | 7/1987 | Kimura et al. ........... | 328/26 |
| 4,794,342 | 12/1988 | Kimura ..................... | 330/252 |
| 4,972,512 | 11/1990 | Garskamp ................. | 328/145 |
| 4,990,803 | 2/1991 | Gilbert ...................... | 328/145 |
| 5,057,717 | 10/1991 | Kimura ..................... | 328/145 |
| 5,122,760 | 6/1992 | Nishijima ................. | 328/26 |
| 5,126,846 | 6/1992 | Niimura .................... | 328/145 |
| 5,223,927 | 6/1993 | Kageyama et al. ...... | 307/494 |

FOREIGN PATENT DOCUMENTS 62-292010 12/1987 Japan.
63-24377  2/1988 Japan.

*Primary Examiner*—Timothy P. Callahan
*Assistant Examiner*—T. Lam
*Attorney, Agent, or Firm*—Sughrue, Mion, Zinn, Macpeak & Seas

[57]          ABSTRACT

A C-MOS logarithmic IF amplifier is provided which comprises a plurality of IF amplifiers cascade-connected to each other through a first coupling capacitor, a plurality of rectifiers each receiving a signal from the corresponding one of the plurality of IF amplifiers through a second coupling capacitor different in capacity from the first coupling capacitor, and an adder for adding the output signals of these rectifiers to each other. The first and second coupling capacitors are preferable to be connected in series to cascade-connect those IF amplifiers therethrough. Each of the rectifiers is applied with an output signal of the corresponding one of the IF amplifier from the connection point of the corresponding first and second coupling capacitors. By setting the first and second capacitors at optimum capacitive values, respectively, the IF amplifiers each makes it possible to cut off the low band side of its frequency band and the rectifiers each makes it possible to expand its frequency band to the low band side.

6 Claims, 10 Drawing Sheets

LOGARITHMIC INTERMEDIATE-FREQUENCY AMPLIFIER

BACKGROUND OF THE INVENTION

1. Field of the Invention

This invention relates to a logarithmic intermediate-frequency amplifier, and more particularly, to a logarithmic intermediate-frequency amplifier having true logarithmic characteristic or pseudo logarithmic characteristic.

2. Description of the Related Art

In general, a logarithmic intermediate-frequency (IF) amplifier comprises IF amplifiers cascade-connected to each other in a multistage connection manner, rectifiers for receiving output signals of these IF amplifiers in a successive manner, and an adder for adding all output signals of these rectifiers to each other, and is generally formed on a bipolar integrated circuit. This is based on such advantageous facts that bipolar transistors have superior noise characteristics as well as low sensitivity degradation when considered from the viewpoint of a received input, and it can be driven even at a low impedance or at a large capacity because the bipolar transistor has a high drivability and the like.

Recently, a C-MOS logarithmic IF amplifier has been demanded to be developed in order to effectively use the advantages of the C-MOS integrated circuit. In this case, however, the following problems have been pointed out on a structural basis;

An MOS transistor is large in l/f noise, so that it is required to have an intermediate-frequency (IF) band cut off its low band side in order to prevent the sensitivity from being degraded from the viewpoint of a received input. So-called HPF (High Pass Filter) characteristic to cut off this low band side can be equivalently obtained by providing IF amplifiers to a multistage cascade-connection manner through coupling capacitors. In this case, however, a coupling capacitor to be inserted is desired to be small in capacity, On the other hand, the multistage connection of the IF amplifiers through the coupling capacitors makes that the rectifiers receiving output signals of respective IF amplifiers differentiate the signal waveforms thereof, thus making it easy to vary the direct-current value of an output of each rectifier. As a result, in order to obtain a good linear logarithmic characteristic, it is unavoidably required to expand the frequency band of an input signal of each rectifier to the low frequency side, that is, it is required that the capacity of a coupling capacitor to be inserted is increased.

Accordingly, in order to practically realize the C-MOS logarithmic IF amplifier, such a problem has arisen is that for the capacity of a coupling capacitor to be used, such contradictory requirements as shown above must be satisfied. In addition, in case that the capacity of a coupling capacitor to be used is increased, there arises a problem on the drivability of the IF amplifier itself as well.

Next, as a pseudo—logarithmic IF amplifier of a polygonal line approximation type formed on a C-MOS integrated circuit, such a circuit as is, for example, shown in FIG. 1 is known conventionally. This circuit is disclosed in the Japanese Laid-Open patent application No. 62-292010, which comprises n differential amplifiers respectively including MOS transistor pairs (T01, T01), (T02, T02), . . . and (T0n, T0n) and constant-current sources I01, I02, . . . and I0n. These differential amplifiers are cascaded in a n-stage connection manner. The differential amplifiers of the first through nth stages are connected to full-wave rectifiers comprising two pairs of transistors (T11 and T1k), (T21 and T2k), . . . and (Tnl and Tnk), and n constantcurrent sources I11, I12, . . . and I 1n for driving these two pairs of transistors, respectively. The differential amplifier of the (u+1)th stage has a full-wave rectifier comprising two pairs of MOS transistors (T(n+1), and T(n+1)k) and two constant-current sources In(n+1) for driving the two pairs of them, and receiving an output signal of the differential amplifier at the nth stage.

These 2(n+1) pairs of transistors (T11 and T1k), (T21 and T2k), . . . and (T(n+1)l and T(n+1)k) forming full-wave rectifiers each has a gate-width (W) and gate-length (L) ratio (W/L) of 1:k (k>1) thereby to constitute an unbalanced differential pair. Then, in respective two pairs, the transistors having a gate-width (W) and gate-length (L) ratio (W/L) of one (1), or (T11 and T11), (T21 and T21), . . . , and (T(n+1)1 and T(n+1)1) have the drains and gates connected respectively in common, and on the other hand, those having the ratio (W/L) of k, or the transistors (T1k and T1k), (T2k and T2k), . . . and (T(n+1)k and T(n+1)k) have the drains and gates connected respectively in common.

Next to the (n+1) th stage, an adder comprising three MOS transistor pairs (T10, T20), (T80, T40) and (T50, T60) is provided, which sums up the outputs of the full-wave rectifiers of the first to the (n+1)th stages.

With the pseudo-logarithmic IF amplifier arranged as above, the operation will be described below.

First, a transconductance parameter α can be expressed in terms of the gate-width and gate-length ratio (W11/L11) of the transistor T11 on the first stage by the following equation (1);

$$\alpha = \mu n (Cox/2)(W1/L1) \quad (1)$$

where, $\mu n$ is a mobility of MOS transistor; and Cox is a gate oxide film capacity per unit area.

In addition, with the transistor pair (T11, T1k) on the first stage, a ratio k between the gate-width and gate-length ratio of one transistor T11 of the pair and that of the other transistor T1k can be expressed as follows:

$$k = \frac{(W1k/L1k)}{(W11/L11)} \quad (2)$$

Further in addition, in the two pairs of transistors (T11 and T1k) of the first stage, if the gate-to-source voltages of respective transistors are expressed as Vgs1, Vgs2, Vgs3 and Vgs4, and the threshold voltage of each transistor is expressed as Vt, the currents of respective transistors I1, I2, I3 and I4 can be expressed as follows;

$$I1 = (Vgs1 - Vt)^2 \quad (3)$$

$$I2 = k\alpha(Vgs2 - Vt)^2 \quad (4)$$

$$I3 = \alpha(Vgs3 - Vt)^2 \quad (5)$$

$$I4 = k\alpha(Vgs4 - Vt)^2 \quad (6)$$

Here, these currents I1, I2, I3 and I4 can be expressed in terms of a current I11 of the constant-current source of the first stage as follows:

$$I1 + I2 = I11 \quad (7)$$

$$I3 + I4 = I11 \quad (8)$$

Also, an input voltage VIN of the two pairs of transistors (T11 and T1k) of the first stage can .be expressed in terms of the gate-to-source voltages Vgs1, Vgs2, Vgs3 and Vgs4 of the transistors as follows;

$$VIN = Vgs1 - Vgs2 = Vgs4 - Vgs3 \quad (9)$$

As a result, an output current ΔI1 of the two pairs of transistors (T1l and T1k) can be expressed as follows:

$$\Delta I1 = (I1 - I2) - (I4 - I3) \quad (10)$$
$$= \frac{-2(1 - 1/k)\{(1 + 1/k) \cdot I11 - 2\alpha \cdot VIN^2\}}{(1 + 1/k)^2}$$

From Eq. (10), it can be found that the output current ΔI1 has a square full-wave rectification characteristic with respect to the input voltage VIN.

In the same manner as above, an output current ΔI2 of the two pairs of transistors (T2l and T2k) of the second stage. . ., and an output current In+1 of the two pairs of the transistors (T(n+1)1 and T(n+1)k) can be respectively expressed as follows:

$$\Delta I2 = \frac{-2(1 - 1/k)\{(1 + 1/1k) \cdot I22 - 2\alpha \cdot VIN^2\}}{(1 + 1/k)^2} \quad (11)$$

$$\Delta In + 1 = \quad (12)$$
$$\frac{-2(1 - 1/k)\{(1 + 1/1k) \cdot I(n+1) - 2\alpha \cdot VOUT^2\}}{(1 + 1/k)^2}$$

Here, it is clear that the output currents ΔI1, ΔI2. . ., ΔIn+1 and the constant-current sources I11, I22, . . . , and In(n30 1) of respective stages are related as shown by the following equations (13) to (15);

$$-2I11 \leq \Delta I1 \leq 2I11 \quad (13)$$
$$-2I22 \leq \Delta I2 \leq 2I22 \quad (14)$$
$$-2In(n+1) \leq In+1 \leq 2In(n+1) \quad (15)$$

This means that even if the input voltage VIN and the output voltages V1, V2 . . . ., VOUT of respective stages are made large, the output currents ΔI1, ΔI2, . . . ΔIn+1 are always within the respective ranges shown by Eqs. (13) to (15). In addition, the .voltage V1, V2 . . . VOUT are output voltages of the differential amplifiers of respective stages, and as the input voltage ][IN is increased gradually, these voltages are successively saturated in the order of VOUT, . . . V2, and V1.

Also, the output current IOUT of the adder consisting of the three MOS transistor pairs (T10, T20), (T30, T40) and (T50, T60) can be expressed as follows:

$$IOUT = \Delta I1 + \Delta I2 + \ldots + \Delta In + 1 \quad (16)$$

As a result, by suitably setting the constant current values I01, I02, . . . and I0n of the constant-current sources of respective stages and the resistance values R01. R02, . . . , and R0n of resisters to be connected to the drains of respective transistors, the maximum output voltages of the differential amplifiers of respective stages can be made of a constant sign. This means that the characteristic of the output current IOUT can be made approximately of a logarithmic characteristic to the input voltage VIN.

With the conventional pseudo-logarithmic IF amplifier arranged as shown above, it makes one full-wave rectifier of two unbalanced differential transistor pairs and as a result, the number of constant-current sources required is twice the number of rectifiers, resulting in a problem of large current consumption. In addition, considered from the viewpoint of the circuit structure, one rectifier uses two unbalanced differential transistor pairs and as a result, the circuit scale disadvantageously becomes large.

This invention was made with a view to solving the above-mentioned problems, an object of this invention is to provide a logarithmic IF amplifier in which contradictory requirements on the capacity of a coupling capacitor to be inserted can be satisfied thereby to be formed on a C-MOS integrated circuit.

Another object of this invention is to provide a pseudo-logarithmic IF amplifier capable of reducing power consumption as well as decreasing circuit scale.

As the applications related to this invention, the followings are concerned; the Japanese Patent Application No. 2-292866 previously made by the same applicant; the U.S. patent application No. 784,502 which was made correspondingly thereto; and the British, German and French Patent Application No. 91310038.4 based on the European Patent Convention.

SUMMARY OF THE INVENTION (1) In a first aspect of this invention, a C-MOS logarithmic IF amplifier is provided which is realizable on a C-MOS integrated circuit.

A C-MOS logarithmic IF amplifier of this aspect comprises a plurality of IF amplifiers cascade-connected through a first coupling capacitor to each other, a plurality of rectifiers each receiving a signal from the corresponding one of the IF amplifiers through a second coupling capacitor different in capacity from the first coupling capacitor, and an adder for adding the output signals of the rectifiers to each other.

With the C-MOS logarithmic IF amplifier arranged as above, the first and second coupling capacitors are preferably connected in series to each other thereby cascade—connecting the IF amplifiers therethrough. Each of the rectifiers is applied with an output signal of the corresponding one of the IF amplifiers at the connection point of the corresponding first and second coupling capacitors.

An IF amplifier to be used for this invention is not specifically limited in structure thereby, an arbitrarily structured one can be used therefor, and a rectifier to be used for this invention is not specifically limited in structure thereby, so that either of a half-wave or full-wave rectifier can be used therefor.

With the C-MOS logarithmic IF amplifier of this aspect, the IF amplifiers are connected through the first coupling capacitor to each other and the rectifiers are connected to each other through the second coupling capacitor different in capacity from the first coupling capacitor. As a result, by setting the first and second coupling capacitors at optimum capacitive values respectively, the IF amplifiers each makes it possible to have its frequency band cut off the low band side thereof, and the rectifiers each makes it possible to have its frequency band expanded to the low band side. Accordingly, (I/f) noise of an IF amplifier can be reduced thereby restricting degradation of noise figure (NF). In addition, the input band of a rectifier can be expanded to the low band side thereby obviating excessive signal differentiation and positively maintaining linearity of the logarithmic characteristic. Consequently, the C-MOS logarithmic IF amplifier according to this invention can be realized on a C-MOS integrated circuit.

(2) In a second aspect of this invention, a pseudo-logarithmic IF amplifier is provided which is realizable on a C-MOS integrated circuit. This amplifier has two types, a first and second.

A pseudo-logarithmic IF amplifier of the first type comprises a plurality of differential amplifiers cascade-connected in a plurality of stages, a first half-wave rectifier for receiving an input signal of the differential amplifier of a first one of the stages, a plurality of second half-wave rectifiers each receiving an output signal of the corresponding one of the differential amplifiers other than that at the first stage, and an adder for adding the direct-current components of outputs of the first and second rectifiers. The first and second rectifiers each has one or more unbalanced differential transistor pairs different in gate-width and gate-length ratio from each other thereby outputting the direct-current component of a differential output current of the same.

A pseudo-logarithmic IF amplifier of the second type comprises a plurality of differential amplifiers cascade-connected in a plurality of stages, a first half-wave rectifier for receiving an input signal of the differential amplifier of a first one of the stages, a plurality of second half-wave rectifiers each receiving an output signal of the corresponding one of the differential amplifiers other than that at the first stage, and an adder for adding outputs of the first and second half-wave rectifiers and outputting the direct-current components thus added, or for receiving outputs of the first and second rectifiers to form their direct-current components thereby to be added to each other. Similar to the first type, the first and second rectifiers each has one or more unbalanced differential transistor-pairs different in gate-width and gate-length ratio from each other, but different from the first type in that each of them is so structured that is adapted to output its differential output current directly.

With the first and second types of the pseudo-logarithmic IF amplifier in this aspect, in case that two or more unbalanced differential transistor-pairs different in gate-width and gate-length ratio are to be provided, it is preferable that the transistors each with a relatively small gate-width and gate-length ratio have the drains and gates connected respectively in common, and the transistors each with a relatively large gate-width and gate-length ratio have the drains and gates connected respectively in common.

With the pseudo-logarithmic IF amplifier according to this invention, a half-wave rectifier having one or more unbalanced differential transistor-pairs is used as the rectifier, and a direct-current component of its differential output current is added, or its differential output current is added and then, the direct-current component is taken out therefrom. As a result, current consumption and circuit scale can be advantageously reduced.

In addition, when two or more unbalanced differential transistor pairs are provided, an improvement in linearity of logarithmic characteristic results as compared with the case that one pair of them is used.

DESCRIPTION OF THE PREFERRED EMBODIMENTS

The preferred embodiments of this invention will be described below while referring to FIGS. 2 to 10.

First Embodiment

Figure 1:
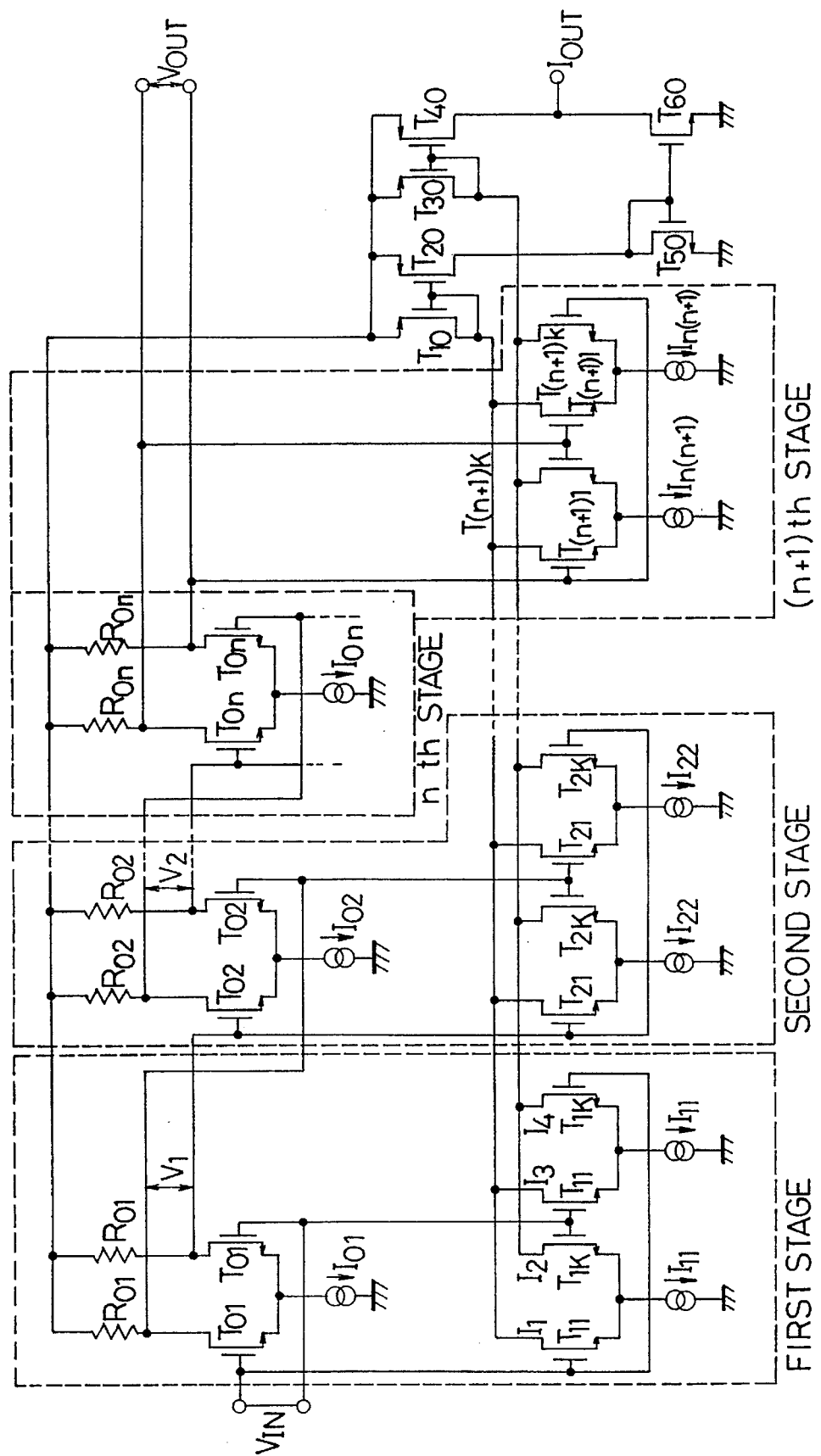
FIG. 1 is a circuit diagram showing an example of a conventional pseudo-logarithmic IF amplifier.
Figure 2:
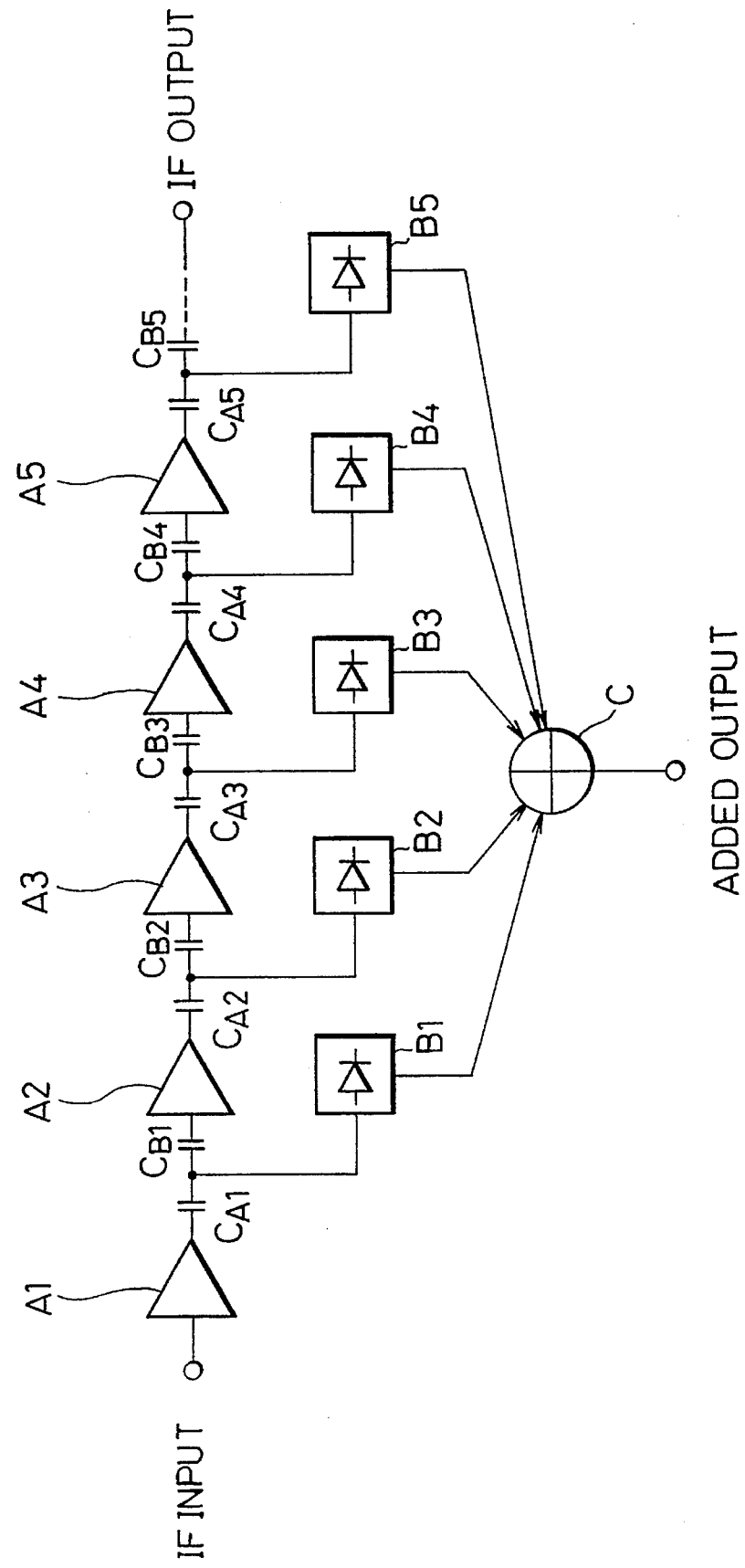
FIG. 2 is a circuit block diagram of a C-MOS logarithmic IF amplifier according to a first embodiment of this invention.

FIG. 2 shows a C-MOS logarithmic IF amplifier according to a first embodiment of this invention, in which a plurality of IF amplifiers A1, A2, . . . are cascaded in a multistage connection manner in order to amplify an IF signal successively. The multistage cascade—connected amplifiers A1, A2, . . . have rectifiers B1, B2, . . . connected thereto in order to rectify their output signals, respectively. Output signals of the rectifiers B1, B2, . . . are sent to an adder C to be added to each other and outputted. The IF amplifiers A1, A2, . . . the rectifiers B1, B2, . . . and the adder C are respectively made of MOS transistors.

These IF amplifiers A1, A2, . . . are cascade-connected to each other through the two capacitors which are connected in series between each adjacent two of these IF amplifiers. Each of the IF amplifiers A1, A2, . . . is connected to the corresponding one of these rectifiers B1, B2, . . . at the connection point of the two capacitors connected in series therebetween. Namely, the IF amplifiers A1 and A2 are cascade-connected to each other through the capacitors CA1 and CB1 which are disposed in series therebetween. The IF amplifier A1 is connected to the rectifier B1 at the connection point of the capacitors CA1 and CB1. In addition, the IF amplifiers A2 and A3 are cascade-connected to each other through the capacitors CA2 and CB2 which are disposed in series therebetween, and the IF amplifier A2 is connected to the rectifier B2 at the connection point of the capacitors CA2 and CB2. The IF amplifiers A3 and A4, A4 and A5, . . . are cascade-connected to each other and connected correspondingly to the rectifiers B3, B4, . . . in the same manner as shown above.

In the following description, an IF amplifier Ai, rectifier Bi and capacitor CAi and CBi (i=1, 2, . . . ) typically show there amplifiers, rectifiers and capacitors, respectively. Thus, an input signal to a rectifier Bi is supplied to the gate of a MOS transistor thereof, so that the input impedance becomes high and yet the direct-current biasing to the gate can be made of a high input impedance. As a result, if the input impedance of the rectifier Bits neglected, a combined capacity Ci of the capacitors CAi and CBi can be approximated as follows;

$$C_i = (CA_i \cdot CB_i)/CA_i + CB_i) \tag{21}$$

That is, the IF amplifiers Ai and A(i+1) are coupled through the combined capacity Ci to each other, and the IF amplifier Ai and the rectifier Bi are coupled to each other through only the capacity of the capacitor CAi.

In addition, the low band side of a frequency band is determined by the differential characteristic (HPF characteristic) of each coupling capacitor. As a result, the ratio of a low band side cut-off frequency fcIFi of the IF amplifier Ai and a low band side cut-off frequency fcRECTi of the rectifier Bi can be expressed as follows;

$$fcIFi/fcRECTi = CA_i/C_i = (CA_i/CB_i) + 1 (>1) \tag{22}$$

From Eq.(22), it can be found that the low band side cut-off frequency fcIFt of the IF amplifier Ai can be made high compared with the low band side cut-off frequency fcRECTi of the rectifier Bi.

In this case, a lead capacity of the IF amplifier Ai is the combined capacity Ci, however, if $CA_i = CB_i = C_o$, from Eq. (21). $C_i = (\frac{1}{2}) C_o$, which means that the capacity of an inter-stage coupling capacitor of the IF amplifier Ai becomes half that of a coupling capacitor with the rectifier Bi. As a result, from Eq. (22), fcIFi=2fcRECTi is obtained, which means that the low band side cut-off frequency of the rectifier Bi can be decreased up to a half of that of the IF amplifier Ai.

Consequently, according to this invention, an IF amplifier is allowed the low band side of its frequency band to be cut off and on the other hand, a rectifier is allowed its frequency band to be expanded to the low band side, so that a logarithmic IF amplifier can be obtained which is formed on a C-MOS integrated circuit without creating any important problem.

Second Embodiment

Figure 3:
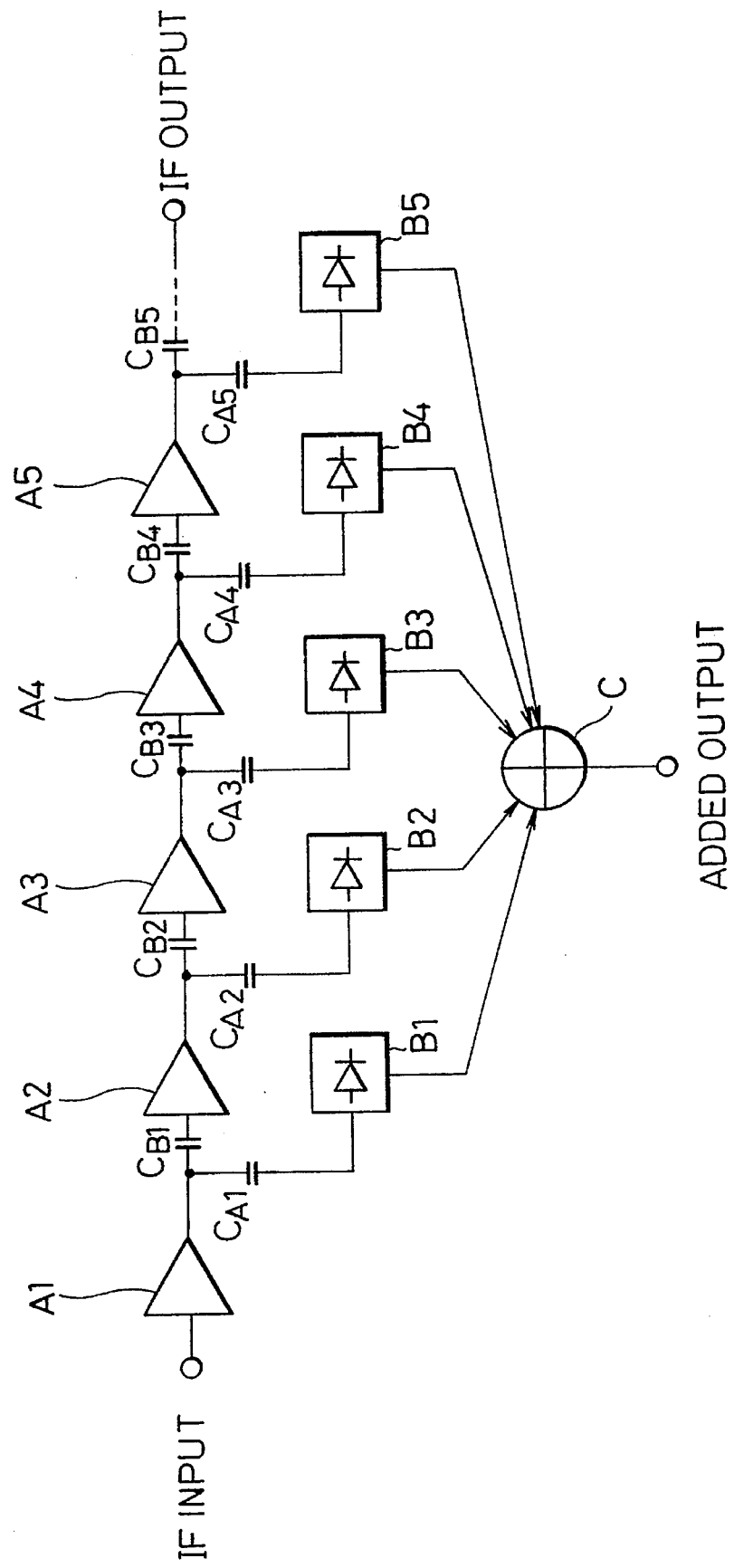
FIG. 3 is a circuit block diagram of a C-MOS logarithmic IF amplifier according to a second embodiment of this invention.

FIG. 3 shows a C-MOS logarithmic IF amplifier according to a second embodiment of this invention. In FIG. 3, an IF amplifier Ai is connected through a capacitor CBi to an IF amplifier A(t+1) and through a capacitor CBi whose capacity is different from that of the capacitor CAi to a rectifier Bi. Other components are arranged as explained in the first embodiment. The C-MOS logarithmic IF amplifier of this embodiment makes it possible to obtain the same effects as shown in the first embodiment.

First Example of Rectifier to be used in First and Second Embodiments

In the first and second embodiments, any circuit made of C-MOS transistor can be arbitrarily used as the rectifier Bi. In this case, however, a squaring circuit can be pointed out as an example as shown in FIG. 4, which is disclosed in the Japanese Laid-Open Patent Application No. 63-24377 made by the same one as the inventor of this amplifier, thus being used as a squaring full-wave rectifier.

Figure 4:
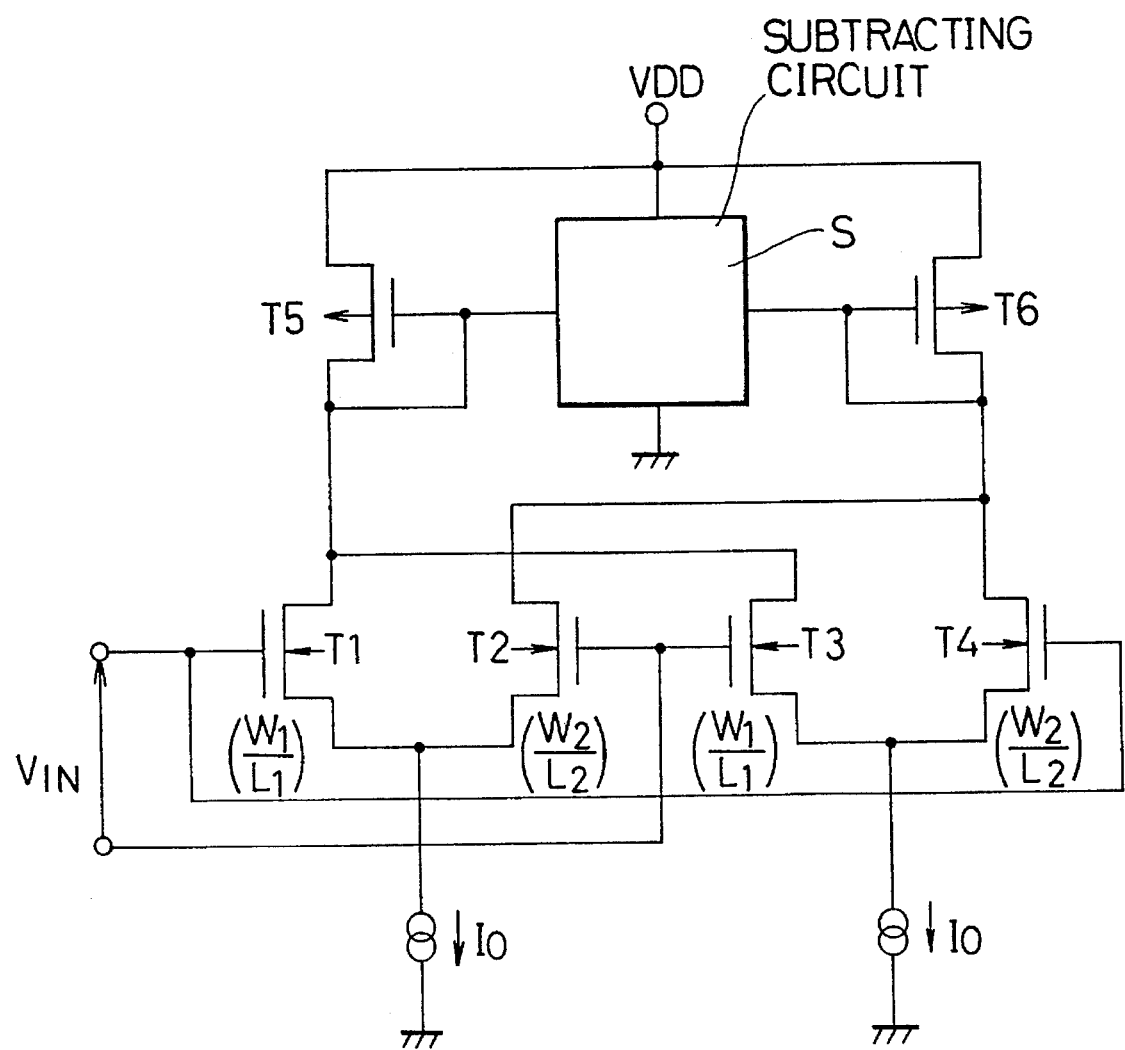
FIG. 4 is a circuit diagram showing one example of a rectifier to be used in the amplifier shown in FIG. 2 or 3.

In FIG. 4, the squaring circuit comprises a first differential transistor-pair consisting of a MOS transistor T1 with a gate-width and gate-length ratio (W1/L1) and a MOS transistor T2 with a gate-width and gate-length ratio (W2/L2) and a second differential transistor-pair consisting of a MOS transistor T3 with the same ratio as that of the transistor T1, (W1/L1). and a MOS transistor T4 with the same ratio as that of the transistor T2, (W2/L2). In this case, if the ratio (W1/L1) is made one (1), the ratio (W2/L2) is made k. The transistors T1 and T2 have the sources connected in common and the transistors T3 and T4 have the sources connected in common, which are connected through their connection points to constant-current sources I0, respectively. The gate of the transistor T1 is connected to that of the transistor 4, and the gate of the transistor T2 is connected to that of the transistor T3. The collector of the transistor T1 is connected to that of the transistor T3, and the collector of the transistor 2 is connected to that of the collector T4. An input voltage VIN is applied across the common gate of the transistors T1 and T4 and the common gate of the transistors T2 and T3, which are different in the gate-width and gate-length ratio from each other. Transistors T5 and T6 each is the primary side transistor of a current mirror circuit. A subtracting circuit S subtracts a current flowing in the output line of the second differential pair from a current flowing in the output line of the first differential pair, VDD is a voltage source.

With the circuit arranged as above, the characteristics will be explained below.

Drain currents Id1 and Id2 of the transistors T1 and T2 of the first differential pair and drain currents Id3 and Id4 of the transistors T3 and T4 of the second differential pair can be expressed as follows;

$$Id1 = \alpha 1 (VGS1 - VT)^2 \tag{23}$$

$$Id2 = \alpha 1.k(VGS2 - VT)^2 \tag{24}$$

$$Id3 = \alpha 1 (YGS3 - VT)^2 \tag{25}$$

$$Id4 = \alpha 1.k1(VGS4 - VT)^2 \tag{26}$$

where, VGS1, VGS2, VGS3 and VGS4 are gate-to-source voltages of the transistors T1, T2, T3 and T4, respectively, and VT is the threshold voltage of each transistor.

In these equations, if the mobility of an electron of MOS transistor is expressed as μn and the gate oxide film capacity per unit area of MOS transistor is expressed as Cox, the following equations can be obtained, as $$\alpha 1 = \mu n (COX/2)(W1/L1) \tag{27}$$

$$k1 = (W2/L2)/(W1/L1) \tag{28}$$

In addition, the constant-current value I0 of the constant-current source, and the input voltage VIN can be expressed as follows;

$$Id1 + Id2 = I0 \tag{29}$$

$$Id3 + Id4 = I0 \tag{30}$$

$$VGS1 - VGS2 = VIN \tag{31}$$

$$VGS3 - VGS4 = VIN \tag{32}$$

Here, if ΔIdI is defined as $$\Delta IdI = Id1 - Id2 \tag{33},$$

it can be obtained by the following equation, as $$\Delta IdI = [-(1 + 1/k1)(1 - 1/k1)I0 + 2\alpha 1 \cdot \tag{34}$$
$$(1 + 1/K1) \cdot VIN^2 + 4\alpha 1 \cdot VIN \cdot (1/K1^{1/2}) \cdot$$
$$\{(1 + 1/K1)(I0/\alpha 1) - VIN^2)\}^{1/2}]/(1 + 1/k1)^2$$

In addition, if ΔIdII is defined as $$\Delta IdII = Id3 - Id4 \tag{35}.$$

it can be obtained as follows;

$$\Delta IdII = [(1 + 1/k1)(1 - 1/k1)I0 + 2\alpha 1 \cdot (1 - 1/K1) VIN^2 + \quad (36)$$
$$4\alpha 1 \cdot VIN(1/K1^{1/2}\{(1 + 1/K1)(I0/\alpha 1) - VIN^2)\}^{1/2}]/(1 + 1/k1)^2$$

Hence, $$\Delta Id - \Delta IdI - IdII = [-2(1+1/k1)(1-1/K1)I0 + 4\alpha 1.(1-1/K1) VIN^2]/(1+1/k1)^2 \quad (37)$$

From Eq. (37), it can be found that the current difference ΔId includes the square term of the input voltage VIN.

On the other hand, the current difference ΔId can be expressed as follows;

$$\Delta Id = (Id1 + Id3) - (Id2 + Id4) \quad (38)$$

From Eq. (38), it can be found that such an output current that is expressed by Eq. (37) including the square ten 0f the input voltage VIN can be obtained by the subtracting circuit S.

As explained above, the square characteristic can be obtained with a simple circuit arranged as shown in FIG. 4, which comprises two differential pairs each consisting of two transistors different in the gate-width and gate-length ratio (W/L) from each other, and in which the transistors with the same gate-width and gate-length ratio (W/L) have the drains connected in common to each other and yet, their outputs become opposite in phase.

Second Example of Rectifier to be used in First and Second Embodiments

Figure 5:
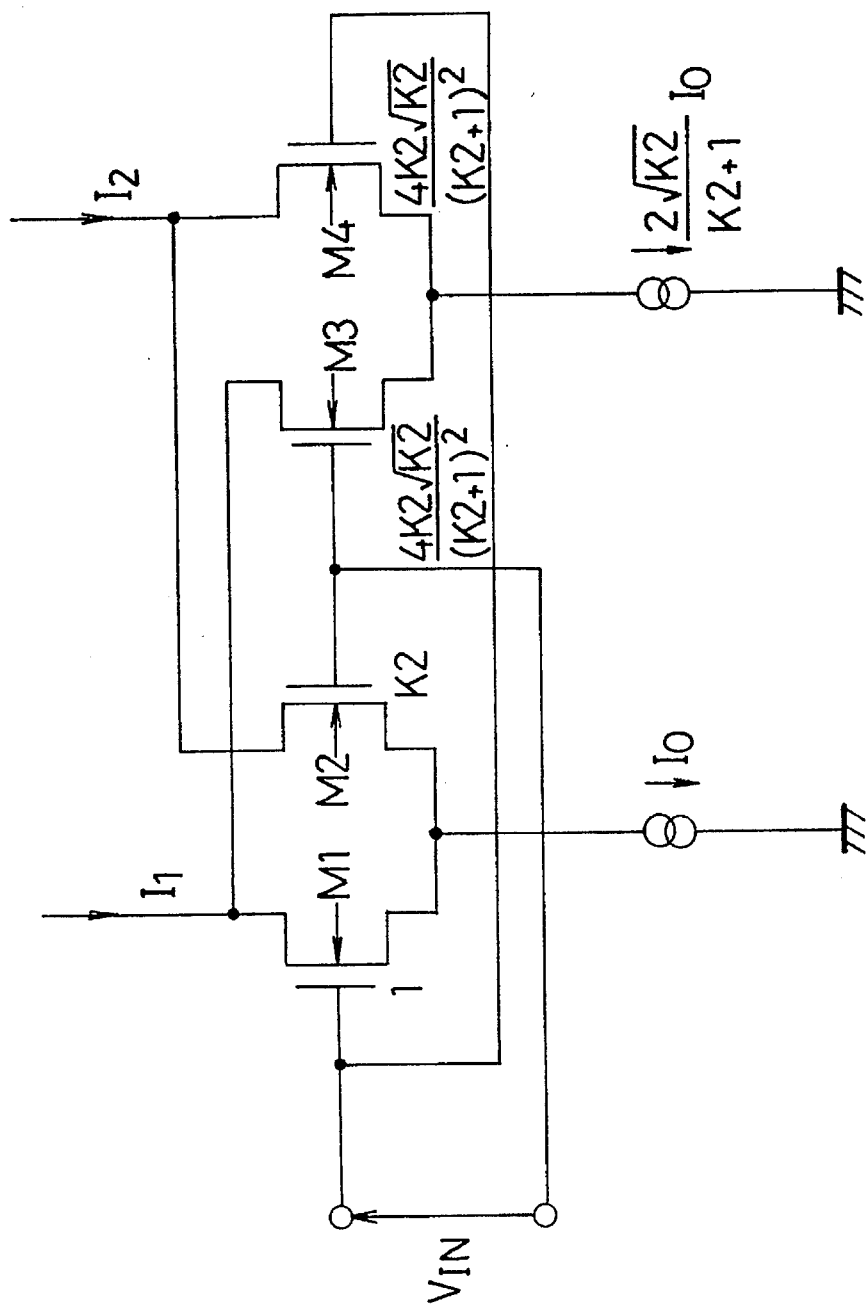
FIG. 5 is a circuit diagram showing another example of a rectifier to be used in the amplifier shown in FIG. 2 or 3.

Another example of a squaring circuit to be used in these embodiments is shown in FIG. 5, which comprises four MOS transistors. In FIG. 5, MOS transistors M1 and M2 constitute a first differential transistor-pair to be driven by a constant-current source I0, and MOS transistors M3 and M4 constitute a second differential transistor-pair to be driven by a constant-current source obtained by the following equation:

$$\{2.k2^{1/2}/(k2+1)\}.I0 \quad (39)$$

Further in FIG. 5, the drain of the transistor M1 is connected to that of the transistor M3, and the drain of the transistor M2 is connected to that of the transistor M4. The gate of the transistor M1 is connected to that of the transistor M4, and the gate of the transistor M2 connected to that of the transistor M3.

Here, with the first differential pair, if the gate-width (W1) and gate-length (L1) ratio (W1/L1) of the transistor M1 is made one (1), the gate-width (W2) and gate-length (L2) ratio (W2/L2) of the transistor M2 is k2. That is, Eq. (28) can be satisfied between them.

Referring to the second differential pair, the gate-width (W3) and gate-length (L3) ratio (W3/L3) of the transistor M3 is equal to the gate-width (W4) and gate-length (L4) ratio (W4/L4) of the transistor M4, which can be expressed in terms of k2 as follows;

$$(W3/L3) = (W4/L4) = \{4k2.k2^{1/2} (k2+1)\}^2 \quad (40)$$

As a result, the drain currents Id1' and Id2' of the transistors M1 and M2 of the first differential pair can be respectively expressed as follows: where VGS1' and VGS2' show the gate-to-source voltage of the transistors M1 and M2 respectively.

$$Id1' = \mu n(COX/2)(W1/L1)(VGS1' - VT)^2 \quad (41)$$

$$Id2' = \mu n(COX/2)k(W1/L1)(VGS2' - VT)^2 \quad (42)$$

In addition, the constant-current I0 and the input voltage VIN can be respectively obtained as follows;

$$Id1' + Id2' = I0 \quad (43)$$

$$VGS1' - VGS2' = VIN \quad (44)$$

Here, if the difference of the Id1' and Id2' is expressed as IdP, or $$\Delta IdP = Id1' - Id2' \quad (45).$$

it can be obtained as follows:

$$\Delta IdP = \frac{-(1 - 1/k2) \cdot \{(1 + 1/k2)I0 - 2\alpha 2 \cdot VIN^2\} + 4\alpha 2\{(1 + 1/K2)(I0/\alpha 2) - VIN^2\}1/2}{(1 + 1/k2)^2} \quad (46)$$

Similarly, the drain currents Id3' and Id4' of the transistors M3 and M4 can be respectively expressed as follows;

$$Id3' = \{4k2 \cdot k2^{1/2}/(k2+1)^2\} \cdot \alpha 2 (VGS3' - VT)^2 \quad (47)$$

$$Id3' = \{4k2 \cdot k2^{1/2}/(k+1)^2\} \cdot \alpha 2 (VGS4' - VT)^2 \quad (48)$$

In addition, the constant-current and the input voltage can be respectively expressed as follows;

$$Id3' + Id4' = \{2 \cdot k2^{1/2}/(k2+1)\} \cdot I0 \quad (49)$$

$$VGS4' - VGS3' = VIN \quad (50)$$

Here, if the difference of the Id3' and Id4' is expressed as IdQ, or $$\Delta IdQ = Id3' - Id4' \quad (51).$$

it can be obtained as follows;

$$\Delta IdQ = \{-4 \cdot k2^{1/2}/(2k+1)^2\}\alpha 2 \cdot VIN \times \quad (52)$$
$$[\{4 \cdot k2^{1/2} \cdot I0/(k2+1)\} \cdot \{(k2+1)^2/4k2 \cdot k2^{1/2} \cdot \alpha 2\} - VIN^2]^{1/2}$$
$$= -\{4\alpha 2 \cdot (1/k2^{1/2})/(k2+1)^2\} \cdot VIN \times$$
$$[\{4 \cdot K2^{1/2} \cdot I0/(k2+1)\} \cdot \{(k2+1)^2/4k2 \cdot K2^{1/2} \cdot \alpha 2\} - VIN^2]^{1/2}$$

As a result, the differential output current I can be obtained as follows;

$$\Delta I = I1 - I2 = IdP - IdQ \quad (53)$$
$$= \frac{(1 - 1/k2) \cdot \{2\alpha 2 \cdot VIN^2 - (1 + 1/k2) \cdot I0\}}{(1 - 1/k2)^2}$$
$$= \{2k2(k2-1)\alpha 2/(k2+1)^2\} \cdot VIN^2 - \{(k2-1)/(k2+1)\} \cdot I0$$

From Eq (53), it can be found that such a differential output current ΔI that is proportional to the square of the input voltage VIN can be obtained.

As explained above, the squaring circuit comprises two differential pairs each consisting of two transistors whose gate-width and gate-length ratios are optimized thereby making a differential input, so that the squaring circuit is not dependent on variation in threshold voltage due to the forming dispersion of transistors.

Third Embodiment

Figure 6:
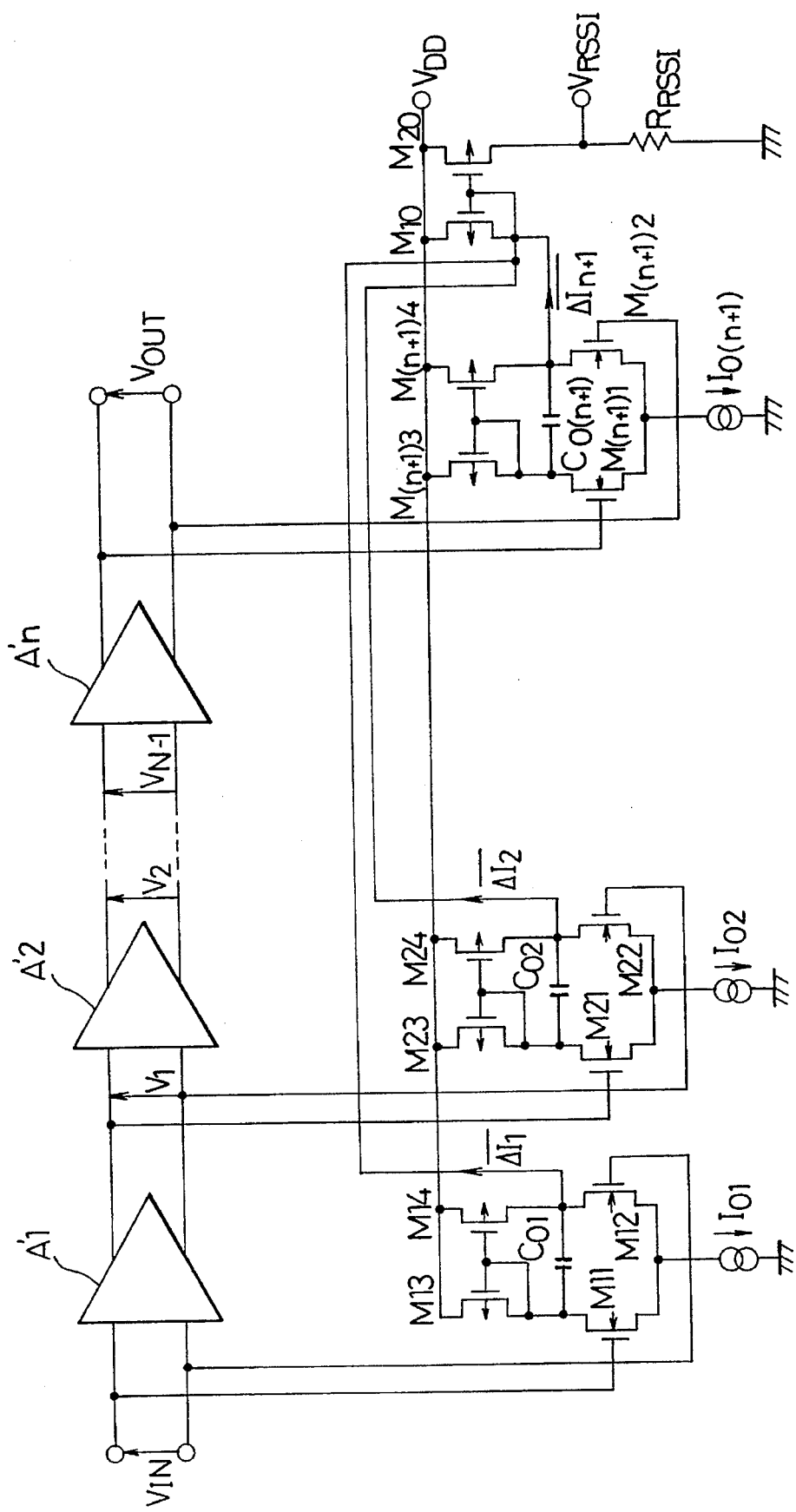
FIG. 6 is a circuit diagram of a pseudo-logarithmic IF amplifier according to a third embodiment of this invention.

FIG. 6 shows a pseudo - logarithmic IF amplifier according to a third embodiment of this invention, which comprises and n differential amplifier A1', A2', . . . , and An' which are cascaded in a n-stage connection manner, a first half-wave rectifier for receiving an input signal to the differential amplifier A1' of the first stage, n second half-wave rectifiers respectively receiving output signals of the differential amplifiers A1', A2', . . . , and An' from the first to nth stages, and an adder for adding the output signals of these half-wave rectifiers. The differential amplifiers A1', A2', . . . , and An' have the same characteristics, and the first and n second half-wave rectifiers have the same structure.

The first stage -half-wave rectifier comprises an unbalanced differential transistor pair consisting of n-channel MOS transistors M11 and M12 different in gate-width and gate-length ratio from each other, a current mirror circuit consisting of p-channel MOS transistors M13 and M14 for forming a differential current, a capacitor C01 for erasing an alternating current component from the differential current thus formed, and a constant-current source I01, thus outputting the direct-current component of the differential output current. The capacitor C01 is provided between the drains of the transistors M11 and M12, and the constant-current source I01 is provided between their sources connected in common and the ground. The drains of the transistors M13 and M14 connected in common are applied with a source voltage VDD, in input voltage VIN to the differential amplifier AI' is applied between the gates of the transistors MI1 and M12. A direct-current component $\overline{\Delta I1}$ of the differential output current is applied between the gate of a MOS transistor M10 and that of a MOStransistor M20 of the adder.

The second half-wave rectifier of the second stage has the same structure as that of the first one, and comprises an unbalanced differential transistor-pair consisting of transistors M21 and M22 different in gate-width and gate-length ratio from each other, a current mirror circuit consisting of transistors M23 and M24 for forming a differential current, a capacitor C02 for erasing an alternating current component of the differential current thus formed, and a constant-current source I02, thus outputting the direct-current component of the differential output current. The capacitor C02 is provided between the drains of the transistors M21 and M22, and the constantcurrent source I02 is provided between their sources connected in common and the ground. The drains of the transistors M23 and M24 connected in common are applied with the source voltage VDD, in output voltage VI of the differential amplifier A1' is applied between the gates of the transistors M21 and M22. A direct-current component $\overline{\Delta I2}$ of the differential output current is applied between the gates of the MOS transistors M10 and M20 of the adder.

The second half-wave rectifier of the (n+1)th stage has the same arrangement as above. That is, it comprises an unbalanced differential transistor pair consisting of transistors M(n+1)1 and M(n+1)2 different in gate-width and gate-length ratio from each other, a current mirror circuit consisting of transistors M(n+1)3 and M(n+1)4 for forming a differential current, a capacitor CO(n+1) for erasing an alternating current component from the differential current thus formed, and a constant-current source I0(n+1), thus outputting the direct-current component of the differential output current. The capacitor CO(n+1) is provided between the drains of the transistors M(n+1)1 and M(n+1)2. and the constant-current source I0(n+1) is provided between their sources connected in common and the ground. The drains of the transistors M(n+1)3 and M(n+1)4 connected in common are applied with the source voltage VDD. An output voltage VOUT of the differential amplifier An' is applied between the gates of the transistors M(n+1)1 and M(n+1)2. A direct-current component $\overline{\Delta In+1}$ of the differential output current is applied between the gates of the MOS transistors M10 and M20 of the adder.

With the transistor pairs (M11. M12), (M21, M22), . . . and (M(n+1)1, M(n+1)2) respectively forming the unbalanced differential-pairs as described above, the gate-width and gate-length ratio of each of the transistors M11, M21 . . . , and M(n+1)1 is smaller than that of each of the transistors M12. M22 . . . . , and M(n+1)2.

The adder comprises a current mirror circuit consisting of a differential-pair of p channel MOS transistors M10 and M20, thereby adding the output currents of (n+1) half-wave rectifiers, or the direct-current components $\overline{\Delta I1}$, $\overline{\Delta I2}$, . . . , and $\overline{\Delta In+1}$ outputted from respective half-wave rectifiers.

In this case, the unbalanced differential transistor-pairs of respective half-wave rectifiers do not necessarily have a gate-width and gate-length ratio equal to each other. However, they are made equal to each other in this explanation for simplification purposes. Thus, the transconductance parameter a 3 can be expressed in terms of the gate-width and gate-length ratio (W11/L11) of the transistor M11 as follows;

$$\alpha 3 = \mu n (Cox/2)(W11/L11) \qquad (61)$$

In addition, in one unbalanced differential pair, the ratio k3 between the gate-width and gate-length ratios of the transistors forming tho pair can be typically expressed in terms of the ratios (W11/L11) and (W12/L12) of the transistors M11 and 1112 of the first stage as follows;

$$k3 = (W12/L12)/(W11/L11) \qquad (62)$$

As a result, drain currents Id11 and Id12 of the transistors M11 and M12 can be expressed as follows, respectively;

$$Id11 = \alpha 3(VGS11 - Vt)^2 \qquad (63)$$

$$Id12 = k3 \cdot \alpha 3(VGS12 - Vt)^2 \qquad (64)$$

In addition, the constant current I01 and input voltage VIN can be expressed as follows, respectively:

$$Id11 + Id12 = I01 \qquad (65)$$

$$VGS11 - VGS12 = VIN \qquad (66)$$

From the equations, ΔI1 (=Id11−Id12) can be obtained as follows:

$$\Delta I1 = Id11 - Id12 = \frac{-\left(1 - \frac{1}{k3}\right)\left\{\left(1 + \frac{1}{k3}\right)I01 - 2\alpha3 VIN^2\right\} + 4\alpha3 \frac{VIN}{k3^{1/2}}\left\{\left(1 + \frac{1}{k3}\right)\frac{I01}{\alpha3} VIN^2\right\}^{1/2}}{\left(1 + \frac{1}{k3}\right)^2} \quad (67)$$

Thus, if I1 is defined as shown by the following equation (68), a direct-current component ΔI1DC, a square characteristic component ΔI1SQ and an alternating current component ΔI1DIFF can be expressed as follows, respectively;

$$\Delta I1 = I1DC + I1SQ + I1DIFF \quad (68)$$
$$\Delta I1DC = \{-(K3 - 1)/(k3 + 1)\} \cdot I01 \quad (69)$$
$$\Delta I1SQ = \{2k3(k3 - 1)\alpha3/(k3 + 1)^2\} \cdot VIN^2 \quad (70)$$

$$\Delta I1DIFF = \frac{4\alpha3 \cdot k3 \cdot VIN \left\{\frac{(k3+1)I01}{\alpha3} - k3 \cdot VIN^2\right\}^{1/2}}{(k3+1)^2} \quad (71)$$

From these equations, the I1DIFF may be considered to be a direct-current characteristic of generally so-called balanced differential-pair that is approximately proportional to the Input voltage VIN, thus becoming the alternating current component to be erased by the capacitor C01. As a result, the direct-current component $\overline{\Delta I1}$ of ΔI1 becomes the sum of A I1DC and a direct-current component $\overline{\Delta I1SQ}$ of the ΔI1SQ as shown by the following equation (72), and if the input voltage VIN is supposed to be of a sine wave and expressed as the following equation (73), the direct-current component $\overline{\Delta I1}$ can be obtained by the following equation (74);

$$\overline{\Delta I1} = \overline{\Delta I1DC} + \overline{\Delta I1SQ} \quad (72)$$
$$VIN = VIN(t) = |VIN|\cos(2\pi ft) \quad (73)$$

$$\overline{\Delta I1} = \frac{k3 - 1}{k3 + 1} I01 + \frac{k3(k3 - 1)\alpha3 \cdot I1}{(k3 + 1)^2} |VIN|^2 \quad (74)$$

In the same manner as above, the direct-current component $\overline{\Delta I2}$ of the output current ΔI2 of the second stage unbalanced differential transistor-pair (M21. M22), and the direct-current component $\overline{\Delta I(n+1)}$ of the output current ΔI(n+1) of the final stage differential transistor-pair (M(n+1)1. M(n+1)2) can be obtained as follows: respectively:

$$\overline{\Delta I2} = \frac{k3-1}{k3+1} I02 + \frac{k3(k3-1)\cdot\alpha3}{(k3+1)^2} |VIN|^2 \quad (75)$$

$$\overline{\Delta In + 1} = \quad (76)$$

$$\frac{k3-1}{k3+1} I01(n+1) + \frac{k3(k3-1)\cdot\alpha3}{(k3+1)^2} |VOUT|^2$$

As a result, the outputs, or the direct-current components of the half-wave rectifiers from the first to (n+1)th stages are added to each other by the adder which the current mirror circuit consisting of MOS transistors and M20 in pair, thus obtaining an output current IRSSI as follows:

$$IRSSI = \overline{\Delta I1} + \overline{\Delta I2} + \ldots + \overline{\Delta In+1} \quad (77)$$

As a result, the output voltage VRSSI can be obtained as follows: where RRSSI is a load registance.

$$VRSSI = RRSSI \cdot IRSSI$$

$$= RSSI \cdot (\overline{\Delta I1} + \overline{\Delta I2} + \ldots + \overline{\Delta In+1}) \quad (78)$$

Figure 7:
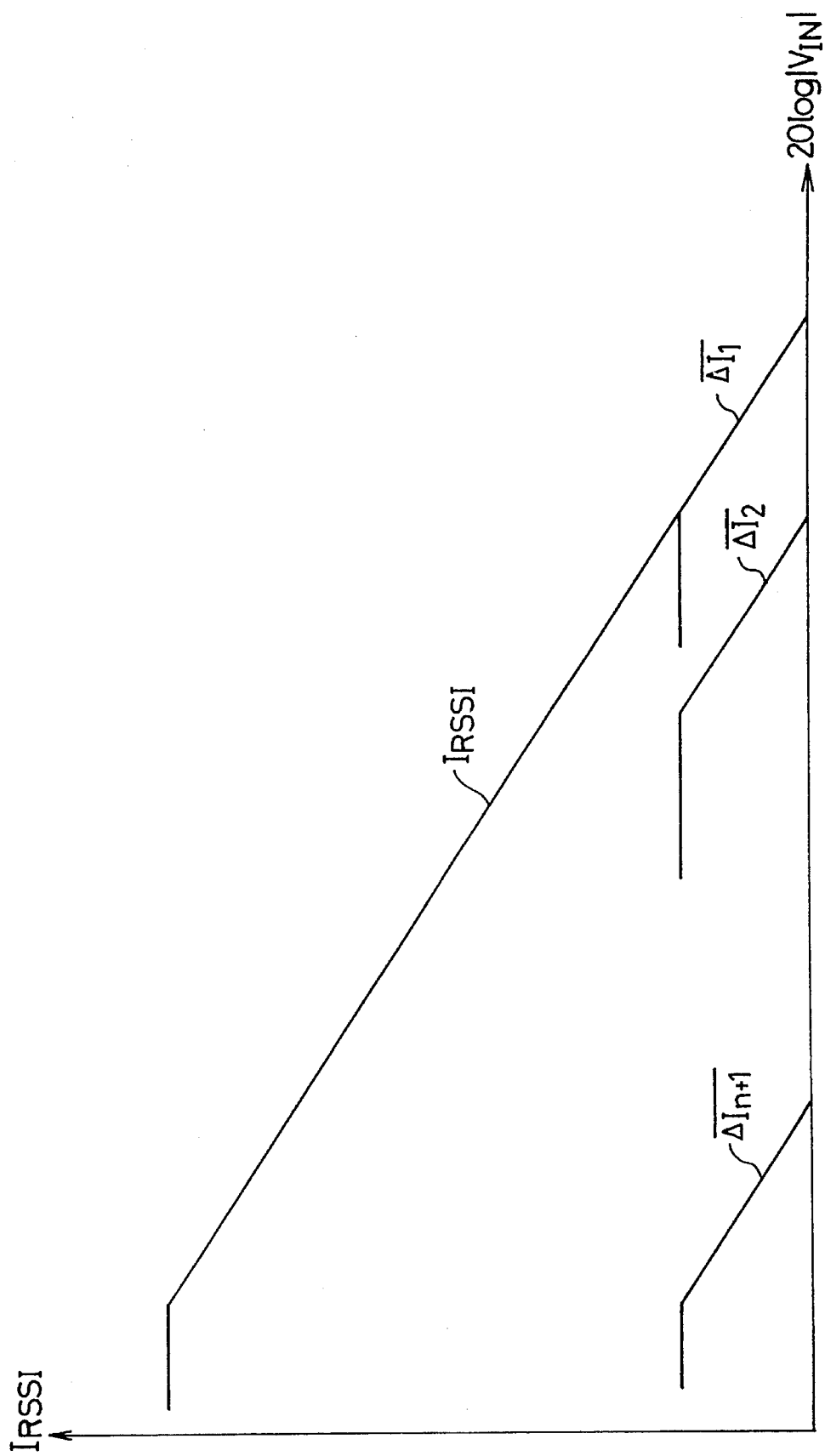
FIG. 7 is a characteristic diagram of the amplifier shown in FIG. 6.

Accordingly, with the circuit shown in FIG. 6, as the input voltage VIN is increased gradually, the output voltages V1, V2, ..., and VOUT of the differential amplifiers A1', A2', ... and An' are successively saturated in the order from VOUT to V1, which is characteristically shown on a decibel (dB) unit basis in FIG. 7.

Fourth Embodiments

Figure 8:
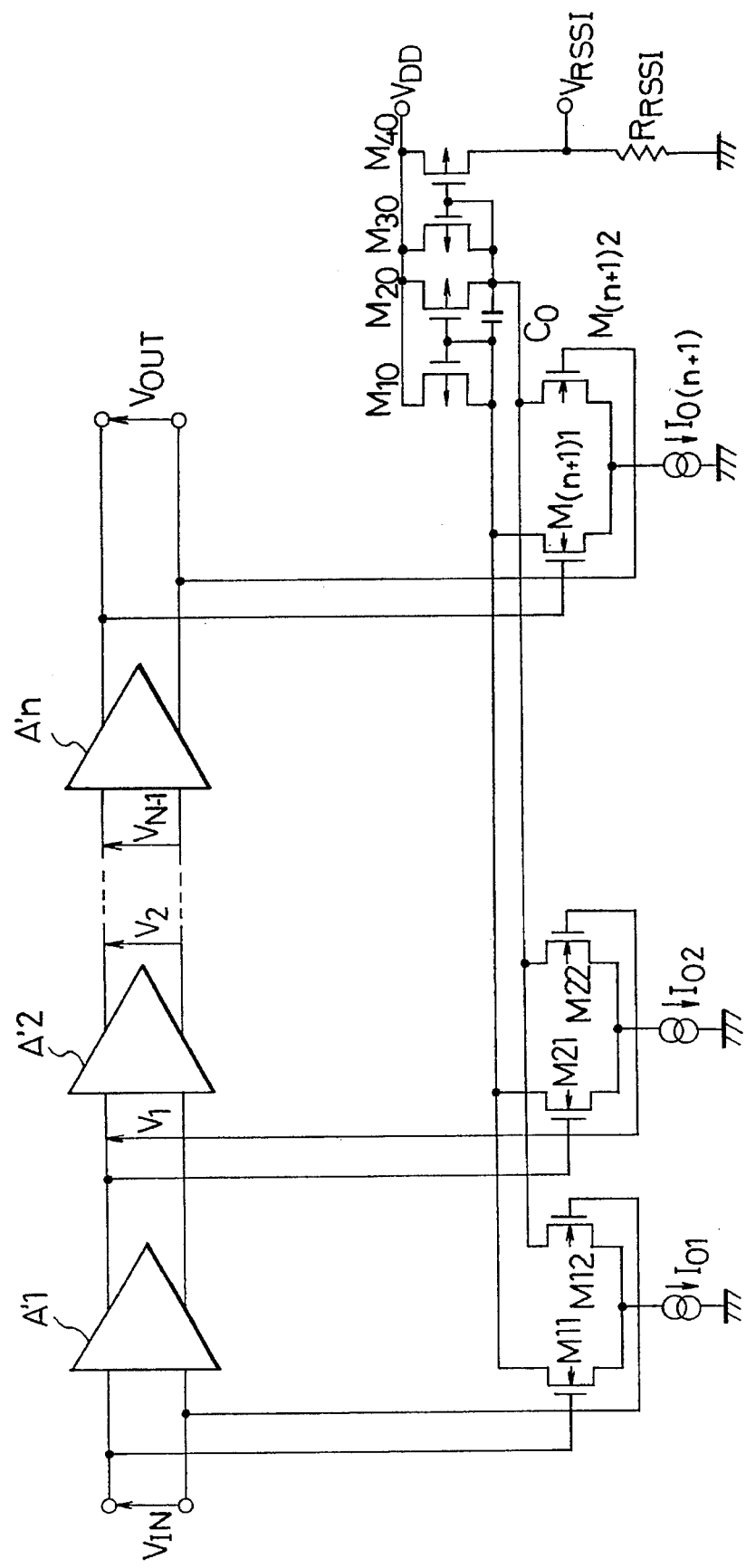
FIG. 8 is a circuit diagram of a pseudo-logarithmic IF amplifier according to a fourth embodiment of this invention.

As is clear from the above explanations with the third embodiment, the pseudo-logarithmic IF amplifier may have a capacitor disposed on the adder side thereof. As a result, the half-wave rectifiers and the adder may be arranged, for example, as follows:

FIG. 8 shows a fourth embodiment of this invention. In the pseudo logarithmic IF amplifier in FIG. 8, the half-wave rectifier each comprises one unbalanced differential transistor-pair, thereby directly outputting a differential output current. The adder has a current mirror circuit consisting of p-channel MOS transistors M30 and M40 for forming a differential current and a capacitor CO for erasing an alternating current component from the differential current thereby to form the direct-current component and added. The capacitor CO is arranged between the gates connected in common of the p-channel MOS transistors M10 and M20 and the drain of the transistor M20. The other arrangement is same as the third embodiment.

In this embodiment, the half-wave rectifier each comprises one unbalanced differential transistor-pair, so that the amplifier of this embodiment is largely effective to make the circuit scale small.

Fifth Embodiment

Figure 9:
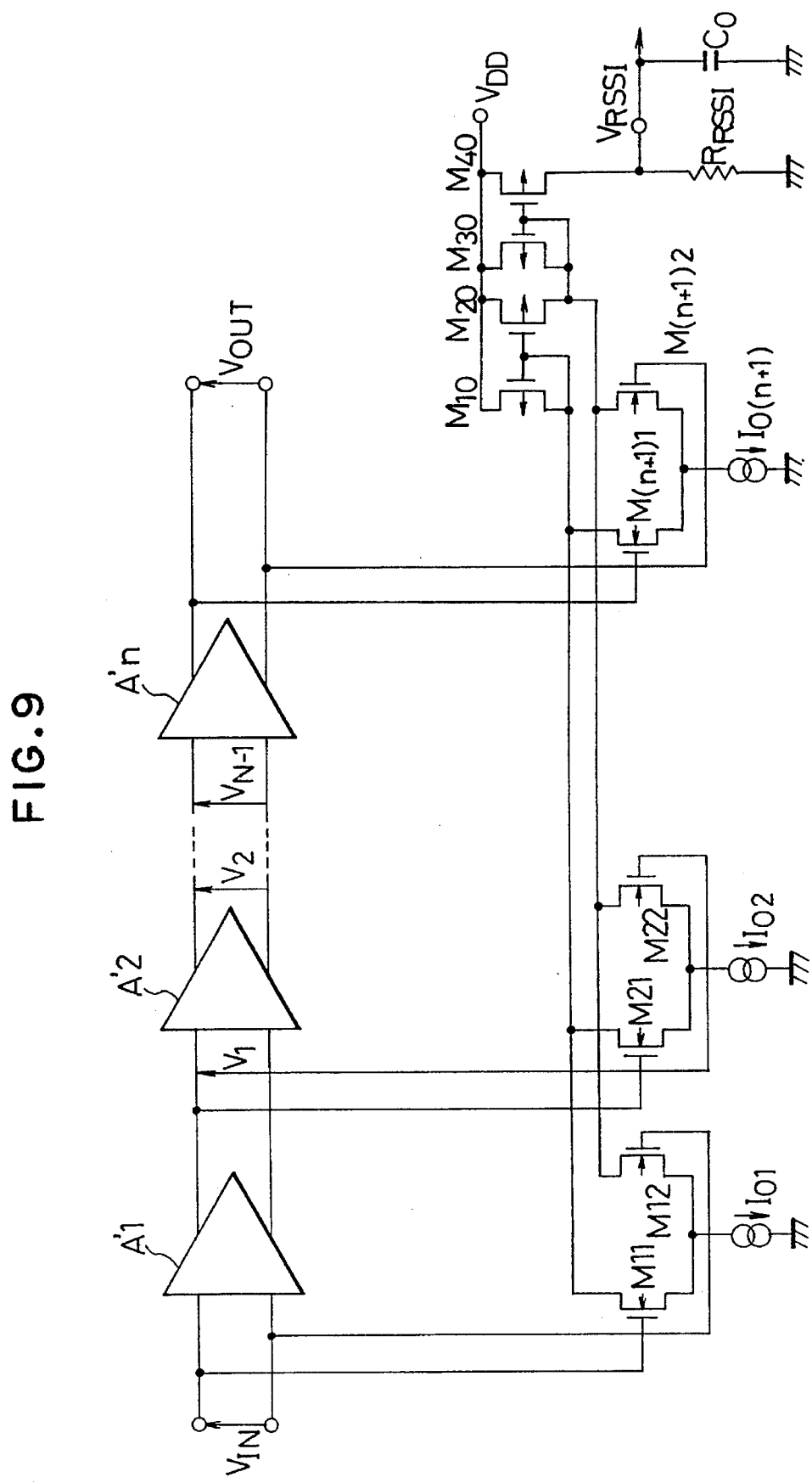
FIG. 9 is a circuit diagram of a pseudo-logarithmic IF amplifier according to a fifth embodiment of this invention.
Figure 10:
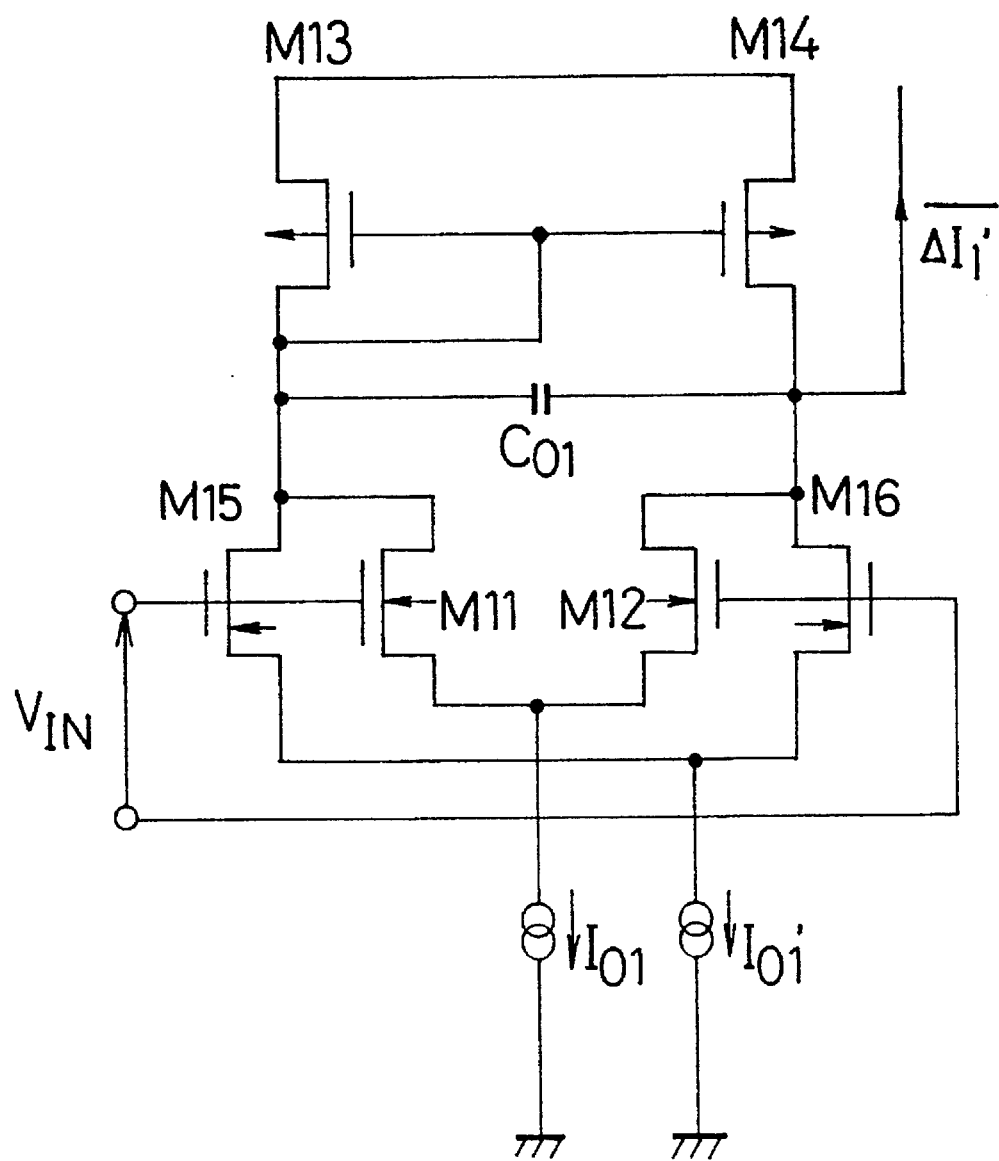
FIG. 10 is a circuit diagram of a half-wave rectifier to be used in the amplifier shown in FIG. 9.

FIG. 9 shows a fifth embodiment of this invention. In the pseudo - logarithmic IF amplifier in FIG. 9, the capacitor CO is arranged between the output terminal and the ground. The other arrangement is the same as the fourth embodiment.

Thus, the adder may have the capacitor CO disposed on the output side thereof. In this case, the direct-current component is taken out after adding all the differential currents. This circuit is also largely effective to make the circuit scale small.

Example of Rectifier to be used in Third to Fifth Embodiments

With the above-described half-wave rectifiers, each can be formed of at least one unbalanced differential transistor-pair. Here, a rectifier with two unbalanced differential transistor-pairs is exemplified in FIG. 10, which is obtained by connecting the unbalanced differential transistor-pair (M11, M12) of the third embodiment shown in FIG. 6 and an unbalanced differential transistor-pair (M15, M16) in parallel. The unbalanced differential transistor-pairs (M11, M12) and (M15. M16) are respectively driven by constant-current sources I01 and I01' difference from each other. The transistors M11 and M15 each with a small gate-width and gate-length ratio have the drains and gates connected in common, and the transistors M12 and M16 each with a large gate-width and gate-length ratio have the drains and gate connected in common.

For the unbalanced differential transistor-pair (M15, M16), the output current thereof $\Delta I12$ and the direct-current component thereof $\overline{\Delta I12}$, can be expressed, as in Eqs. (67) and (74) as follows;

$$\Delta I12 = Id15 - Id16 = \frac{-\left(1 - \frac{1}{k4}\right)\left\{\left(1 + \frac{1}{k4}\right)I01 - 2\alpha 4 VIN^2\right\} + 4\alpha 4 \frac{VIN}{k4^{1/2}}\left\{\left(1 + \frac{1}{k4}\right)\frac{I01}{\alpha 4} VIN^2\right\}^{1/2}}{\left(1 + \frac{1}{k4}\right)^2} \quad (81)$$

$$\overline{\Delta I12} = -\frac{k4 - 1}{k4 + 1} I01 + \frac{k4(k4 - 1)\alpha 4}{(k4 + 1)^2} |VIN|^2 \quad (82)$$

Here, in Eqs.(81) and (82), it is supposed that $\alpha 2$ is equal to $\alpha 1$, or $\alpha 4 = \alpha 3$. In this case, the differential amplifiers to be cascade-connected to each other are not required to have the same gain, however, if they have the same gain gv for simplifying explanations, the following equation will be obtained;

$$\left\{\frac{k3(k3 - 1)}{(k3 + 1)^2}\right\} / \left\{\frac{k4(k4 - 1)}{(k4 + 1)^2}\right\} = gv^{1/2} (>1) \quad (83)$$

As a result, Eq.(74) can be expressed as follows:

$$\overline{\Delta I1} = \frac{k3 - 1}{k3 + 1} I01 + \frac{k4(k4 - 1)\alpha 1}{(k4 + 1)^2} \{gv |VIN|^2\} \quad (84)$$

Thus, if Gv is defined as shown by the following equation (85) and the input voltage VIN is expressed on a decibel (dB) unit basis, it can be found from these equations that the direct-current component $\overline{\Delta I1}$ of the output current $\Delta I1$ is shifted to operate by (½)Gv in the direction that the input level becomes low with respect to the direct-current component $\overline{\Delta I12}$ of the output current $\Delta I12$;

Gv=20log (gv) (85)

This means that for two unbalanced differential transistor-pairs to be disposed at and after the second stage, the same results can be obtained, so that the operational dynamic range of each unbalanced differential transistor-pair will become (½)Gv, resulting in an improvement in linearity of the logarithmic characteristic thereof.

On the other hand, if the gain gv of a differential amplifier Ai is expressed as follows;

$$\left\{\frac{k4(k4 - 1)}{(k4 + 1)^2}\right\} / \left\{\frac{k3(k3 - 1)}{(k3 + 1)^2}\right\} = gv^{1/2} (>1) \quad (86)$$

Eq. (82) can be expressed as follows $$\overline{\Delta I12} = \frac{k4 - 1}{k4 + 1} I01 + \frac{k3(k3 - 1)\alpha 1}{(k3 + 1)^2} \{gv |VIN|^2\} \quad (87)$$

This means that when the input voltage VIN is expressed on a decibel (dB) unit basis, the direct-current component $\overline{\Delta I1}$ of the output current A I1 is shifted to operate by (½)Gv in the direction that the input level becomes high with respect to the direct-current component $\overline{\Delta I12}$ of the output current $\Delta I12$. As a result, for any unbalanced differential transistor-pair to be disposed at and after the second stage, the same results can be obtained, so that the operational dynamic range of each unbalanced differential transistor-pair will become (½)Gv, resulting in an improvement in linearity of the logarithmic characteristic thereof.

In addition, if n=m, and the following equations (88) and (89) are satisfied, the operational dynamic range of each unbalanced differential transistor-pair will become (1/m)Gv, resulting in an improvement in linearity of the logarithmic characteristic thereof.

$$\left\{\frac{km - 1(km - 1 - 1)}{(km - 1 + 1)^2}\right\} / \left\{\frac{km(km - 1)}{(km + 1)^2}\right\} = gv^{1/m} \quad (88)$$

$$\left\{\frac{km(km - 1)}{(km + 1)^2}\right\} / \left\{\frac{km - 1(km - 1 - 1)}{(km - 1 + 1)^2}\right\} = gv^{1/m} \quad (89)$$

As explained above, a pseudo-logarithmic IF amplifier of this invention makes it possible to reduce current consumption as well as to decrease the circuit scale. In addition, in case that the half-wave rectifiers each is formed of two or more unbalanced differential transistor-pairs, the logarithmic characteristic can be effectively improved in linearity.

What is claimed is:

1. A C-MOS logarithmic intermediate-frequency amplifier comprising:

a plurality of intermediate-frequency amplifiers cascade-connected, each of said amplifiers being connected through a first coupling capacitor to each other, an intermediate-frequency input signal being applied to one of said amplifiers disposed at a first stage, each of said amplifiers being formed of MOS transistors;

a plurality of rectifiers, each of which being connected through a second coupling capacitor to corresponding one of said amplifiers to rectify an output signal from said corresponding one of said amplifiers, each of said rectifiers being formed of MOS transistors; and an adder connected to said rectifiers, said adder receiving output signals of said plurality of rectifiers and adding them to each other, said adder generating an output signal varying substantially logarithmically as a function of said intermediate-frequency input signal applied to said amplifier at said first stage;

wherein capacitance values of said first coupling capacitors are set so that each of said amplifiers has a frequency band whose low band side is cut off to reduce (1/f) noise thereof, and capacitance values of said second coupling capacitors are set so that each of said rectifiers has a frequency band whose low band side is expanded to improve linearity of a logarithmic characteristic of said logarithmic intermediate-frequency amplifier.

2. A C-MOS logarithmic intermediate-frequency amplifier comprising:

a plurality of intermediate-frequency amplifiers cascade-connected, each of said amplifiers being connected through serially connected first and second coupling capacitors to each other, an intermediate-frequency input signal being applied to one of said amplifiers disposed at a first stage;

each of said amplifiers being formed of MOS transistors;

a plurality of rectifiers, each of which being connected through said first coupling capacitor to a corresponding one of said amplifiers to rectify an output signal from said corresponding one of said amplifiers;

each of said rectifiers being formed of MOS transistors; and an adder connected to said rectifiers, said adder receiving output signals of said plurality of rectifiers and adding them to each other, said adder generating an output signal varying substantially logarithmically as a function of said intermediate-frequency input signal applied to said amplifier at said first stage;

wherein capacitance values of said first coupling capacitors are set so that each of said rectifiers has a frequency band whose low band side is expanded to improve linearity of a logarithmic characteristic of said logarithmic intermediate-frequency amplifier, and a combined capacitance value of each of said serially connected first and second capacitors is set so that each of said amplifiers has a frequency band whose low band side is cut off to reduce (l/f) noise of said amplifiers.

3. A C-MOS logarithmic intermediate-frequency amplifier as claimed in claim 1, wherein each of said plurality of rectifiers contains at least one of unbalanced differential pair of MOS transistors, and said MOS transistors are different in gate-width to gate-length ratios from each other and sources of said transistors are coupled together.

4. A C-MOS logarithmic intermediate-frequency amplifier as claimed in claim 1, wherein each of said plurality of rectifiers comprises a first differential pair of first and second MOS transistors driven by a first constant current source, and a second differential pair of third and fourth MOS transistors driven by a second constant current source, said second transistor is K times in gate-width to gate-length ratio as much as said first MOS transistor, said third and fourth MOS transistors are both $\{(4K-K^{1/2})/(K+1)^2\}$ times in gate-width to gate-length ratio as much as said first MOS transistor, and said second constant current source is $\{(2K^{1/2})/(K+1)\}$ times in current value as much as said first constant current source.

5. A C-MOS logarithmic intermediate-frequency amplifier as claimed in claim 2, wherein each of said plurality of rectifiers contains at least one unbalanced differential pair of MOS transistors, and said MOS transistors are different in gate-width to gate-length ratios from each other and sources of said transistors are coupled together.

6. A C-MOS logarithmic intermediate-frequency amplifier as claimed in claim 2, wherein each of said plurality of rectifiers comprises a first differential pair of first and second MOS transistors driven by a first constant current source, and a second differential pair of third and fourth MOS transistors driven by a second constant current source, said second MOS transistor having K times a gate-width to gate-length ratio as said first transistor, said third and fourth MOS transistors both having $\{(4K-K^{1/2})/(K+1)^2\}$ times the gate-width to gate-length ratio as said first transistor, and said second constant current source having a current value which is $\{2 K^{1/2}/(K+1)\}$ times that of said first constant current source.

* * * * *

UNITED STATES PATENT AND TRADEMARK OFFICE
CERTIFICATE OF CORRECTION

PATENT NO. : 5,467,046
DATED : November 14, 1995
INVENTOR(S) : Katsuji KIMURA

It is certified that error(s) appears in the above-identified patent and that said Letters Patent is hereby corrected as shown below:

Col. 2, line 4, delete "constantcurrent", insert --constant-current--.

Col. 2, line 24, delete "T80", insert --T30--.

Col. 2, line 52, after "=", insert --a--.

Col. 2, line 67, delete "T1l", insert --T11--.

Col. 3, line 6, delete "T1l", insert --T11--.

Col. 3, line 16, delete "T2l", insert --T21--.

Col. 3, line 35, delete "n30 1", insert --n+1--.

Col. 3, line 48, delete "][IN", insert --VIN--.

Col. 7, line 21, delete "lead", insert --load--.

Col. 7, line 43, delete "t+1", insert --i+1--.

Col. 8, line 61, delete "2αI", insert --2α1--.

Col. 9, line 18, delete "ten Of", insert --term of--.

Col. 10, line 20, delete "VIN$^2$}1/2", insert --VIN$^2$}$^{1/2}$--.

Col. 10, line 27, delete "Id3'", insert --Id4'--.

Col. 10, line 54, before the equation, insert -- = --.

UNITED STATES PATENT AND TRADEMARK OFFICE
CERTIFICATE OF CORRECTION

PATENT NO. : 5,467,046
DATED : November 14, 1995
INVENTOR(S) : Katsuji KIMURA

It is certified that error(s) appears in the above-identified patent and that said Letters Patent is hereby corrected as shown below:

Col. 11, line 30, delete "MI1", insert --M11--.

Col. 12, line 43, delete "1112", insert --M12--.

Col. 13, lines 27 and 28, delete "AI1DC", insert --$\Delta$I1DC--.

Col. 13, line 34, delete "$\Delta$I1 = $\Delta$I1DC + $\Delta$I1SQ", insert --$\overline{\Delta I1}$ = $\Delta$I1DC + $\overline{\Delta I1SQ}$--.

Col. 13, line 37, delete "$\Delta$I1", insert --$\overline{\Delta I1}$--.

Col. 13, line 47, delete "$\Delta$I2", insert --$\overline{\Delta I2}$--.

Col. 13, line 50, delete "$\Delta$In+1", insert --$\Delta$In+1--.

Col. 13, line 57, after "transistors", insert --M10--.

Col. 15, line 10, in equation (81), delete both occurrences of "I01", insert --I01'--.

Col. 15, line 17, in equation (82), delete "$\Delta$I12", insert --$\overline{\Delta I12}$--.

Col. 15, line 17, in equation (82), delete "I01", insert --I01'--.

Col. 15, line 32, delete "$\Delta$I1", insert --$\overline{\Delta I1}$--.

UNITED STATES PATENT AND TRADEMARK OFFICE
CERTIFICATE OF CORRECTION

PATENT NO. : 5,467,046
DATED : November 14, 1995
INVENTOR(S) : Katsuji KIMURA

It is certified that error appears in the above-indentified patent and that said Letters Patent is hereby corrected as shown below:

Col. 15, line 59, delete "$\Delta I12$", insert -- $\overline{\Delta I2}$ --.

Col. 15, line 63, delete "AI1", insert -- $\Delta I1$ --.

Signed and Sealed this

Ninth Day of July, 1996

Attest:

*Attesting Officer*

BRUCE LEHMAN

*Commissioner of Patents and Trademarks*